United States Patent [19]

Hashimoto

[11] Patent Number: 4,878,220
[45] Date of Patent: Oct. 31, 1989

[54] SEMICONDUCTOR MEMORY DEVICE

[75] Inventor: Kiyokazu Hashimoto, Tokyo, Japan

[73] Assignee: NEC Corporation, Tokyo, Japan

[21] Appl. No.: 123,008

[22] Filed: Nov. 19, 1987

[30] Foreign Application Priority Data

Nov. 19, 1986 [JP] Japan .................. 61-277126

[51] Int. Cl.$^4$ .............................................. G06F 11/10
[52] U.S. Cl. .................................. 371/40.1; 371/3
[58] Field of Search .................. 371/3, 38, 13, 27, 37, 371/39, 40

[56] References Cited

U.S. PATENT DOCUMENTS 4,531,213 7/1985 Scheuneman ........................... 371/3
4,561,095 12/1985 Khan ..................................... 371/3 X Primary Examiner—Jerry Smith
Assistant Examiner—Robert W. Beausoliel
Attorney, Agent, or Firm—Sughrue, Mion, Zinn, Macpeak & Seas

[57] ABSTRACT

For sufficient diagnostic operation, there is disclosed a semiconductor memory device having a write-in mode, a read-out mode and a diagnostic mode. The semiconductor memory device includes: (a) a check-bit producing circuit operative to produce check-bits based on data bits of a piece of data information supplied from the outside thereof in the write-in mode; (b) a plurality of memory cell groups each capable of storing the data bits of the piece of data information and the check bits produced by the check-bit producing circuit; (c) an error detecting circuit operative to identify at least one error bit opposite in logic level from the corresponding data bit on the basis of the piece of data information stored in the memory cell group and to produce an output signal consisting of a plurality of data bits and representing the error bitm, if any, in the read-out mode or the diagnostic mode; (d) an error correction circuit supplied with the data bits of the piece of data information stored in the memory cell group and the output signal produced by the error detecting circuit and operative to change the error data bit to the corresponding data bit in the read-out mode or the diagnostic mode; and (e) a test pattern producing circuit operative to produce dummy bits having an error data bit and check bits produced on the basis of the data bits without the error data bit and supplying the dummy bits to the error detecting circuit in the diagnostic mode, so that the diagnostic operations can be achieved for both of the error detecting circuit and the error correction circuit.

9 Claims, 6 Drawing Sheets

PRIOR-ART

PRIOR-ART

PRIOR-ART

SEMICONDUCTOR MEMORY DEVICE

FIELD OF THE INVENTION

This invention relates to a semiconductor memory device and, more particularly, to an error detection and correction circuit incorporated therein.

BACKGROUND OF THE INVENTION

It is well known in the art that errors frequently occur in pieces of data information stored in a memory device due to repeated write-in and read-out operations and alpha-particles emanating from packaging materials. In order to guard the pieces of data information against the errors, the pieces are coded in such a manner that the errors can be detected and even corrected by special logic circuits. FIG. 1 shows a typical example of a semiconductor memory device with the special logic circuit, or an error detecting and correction circuit.

Referring to FIG. 1 of the drawings, the semiconductor memory device comprises an input buffer circuit 1 operative to latch a piece of data information consisting of eight data bits I1 to I8 supplied from the outside thereof, a check-bit producing circuit 2 operative to append four check bits P1 to P4 to the data information supplied from the input buffer circuit 1, a memory cell group 3 provided with twelve memory cells M1 to M12 where the data information with the check bits is stored and having an address which is specified by row and column address signals X and Y, a write-in circuit 4 operative to decide whether or not the data information with the check bits should be written into the memory cell group 3 and to carry out a write-in operation in response to a write-in decision, a read-out circuit 5 operative to read out the data information with the check bits P1 to P4 from the memory cell group 3, an error detecting circuit 6 operative to detect whether or not the data information fed from the read-out circuit 5 has an error among the data bits and to identify the data bit with the error, an error correction circuit 7 operative to retrieve the correct data bit, and an output buffer circuit 8 operative to deliver the data information without the error data bit to the outside of the memory device.

Let the data bits of the data information with the check bits supplied from the red-out circuit 5 be represented by reference symbols D1 to D8. Reference symbols R1 to R8 stand for the respective data bits of the data information corrected by the error correction circuit 7. On the other hand, reference symbols Q1 to Q8 represent respective data bits of an output signal identifying the error data bit. In this example, the data information with the check bits consists of the eight data bits and the four check bits so that the error detecting circuit 6 is capable of identifying only one error data bit in the data information based on the four check bits.

Turning to FIGS. 2, 3 and 4 of the drawings, there is shown the circuit arrangements of the check-bit producing circuit 2, the error detecting circuit 6 and the error correction circuit 7. The check-bit producing circuit 2 comprises four exclusive-OR gates 11, 12, 13 and 14 and each of the exclusive-OR gates 11 to 14 has five input nodes to which preselected data bits of the data information is supplied, respectively. Namely, the exclusive-OR gate 11 is supplied with the five data bits I1, I4, I5, I7 and I8 and produces the check bit P1. Similarly, the exclusive-OR gate 12 is supplied with the five data bits I1, I2, I5, I6 and I8 to produce the check bit P2 and the exclusive-OR gate 13 is supplied with the data bits I2, I3, I5, I6 and I7 to yield the check bit P3. For producing the check bit P4, the data bits I3, I4, I6, I7 and I8 are supplied to the input nodes of the exclusive-OR gate 14, respectively.

The error detecting circuit 6 comprises four exclusive-OR gates 15, 16, 17 and 18 and eight AND gates 19, 20, 21, 22, 23, 24, 25 and 26. The exclusive-OR gate 15 is supplied with the five data bits D1, D4, D5, D7 and D8 and the check bit P1 and produces an output signal A, and the exclusive-OR gate is supplied with the five data bits D1, D2, D5, D6 and D8 and the check bit P2 to produce an output signal B. Likewise, the exclusive-OR gate 17 produces an output signal C on the basis of the five data bits D2, D3, D5, D6 and D7 and the check bit P3, and the exclusive-OR gate 18 is supplied with the data bits D3, D4, D6, D7 and D8 and the check bit P4 to yield an output signal D. Each of the AND gates 19 to 26 has four input nodes one or two of which is accompanied by a bubble or bubbles (indicating that an inverted input is received by the device along those lines) and the four input nodes are coupled to the output nodes of the four exclusive-OR gates 15 to 18, respectively. Namely, the AND gate 19 has the first and second input nodes directly coupled to the respective output nodes of the exclusive-OR gates 15 and 16 but the third and fourth nodes are accompanied by the bubbles and coupled to the output nodes of the exclusive-OR gates 17 and 18 through the bubbles. In a similar manner, the AND gate 20 has the first and fourth input nodes accompanied by the bubbles and the AND gate 21 has the first and second input nodes with the respective bubbles. The AND gate 22 has the second and third input nodes accompanied by the respective bubbles but the AND gate 23 is accompanied by only one bubble coupled to the fourth input node. Likewise, each of the AND gates 24, 25 and 26 is accompanied by one bubble coupled to the first, second or third input node. Then, the data bits mixed with the check bit are supplied to the exclusive-OR gates 15 to 18 for detecting whether or not the data information has an error bit and the AND gates 19 to 26 identify the data bit with error based on the output signals A to D fed from the exclusive-OR gates 15 to 18.

The error correction circuit comprises eight exclusive-OR gates 27, 28, 29, 30, 31, 32, 33 and 34 and each of the exclusive-OR gates 27 to 34 has two input nodes one of which is supplied with each data bit of the data information fed from the read-out circuit 5 and the other of which is supplied with each data bit of the output signal fed from the error detecting circuit 6. With the data bit of logic "0" level from the AND gate 19, 20, 21, 2, 23, 24, 25 or 26, each of the exclusive-OR gates 27 to 34 produces the data bit R1, R2, R3, R4, R5, R6, R7 or R8 identical in logic level to the data bit I1, I2, I3, I4, I5, I6, I7 or I8, however each exclusive-OR gate of the error correction circuit 7 produces the data bit opposite in logic level to the data bit of the data information fed from the read-out circuit 5. As described above, the output signal of the error detecting circuit 6 identifies the error bit, so that the exclusive-OR gates of the error correction circuit 7 retrieve the correct data bits in the presence of the data bits Q1 to Q8 of the output signal, respectively.

Description will be made in detail for error detecting and error correcting operations on the assumption that the data bits I1 to I8 of the data information have respective logic levels "0", "1", "0", "1", "0", "1", "0" and "1" (which is hereinunder referred to as (01010101) and are supplied to the input buffer circuit 1. When the data bits I1 to I8 of the data information are supplied to the check-bit producing circuit 2, the exclusiveOR gates 11 to 14 produces the check bits P1 to P4 which are (0101) because an exclusive-OR gate produces logic "0" in the presence of an even number of logic "1" inputs but logic "1" in the presence of an odd number of logic "1" inputs. As a result of specifying the address of the memory cell group 3, the writein circuit 4 allows the data information with the check bits (0101) to be stored in the respective memory cells M1 to M12 and, for this reason, the memory cells M1 to M12 store the data bits and the check bits of (01010101;0101), respectively. After a while, the memory cell group 3 is specified by the row and column address signals X and Y for read-out operation and the data information with the check bits is read out from the memory cells M1 to M12 to the read-out circuit 5. If no error occurs in the data information, the data information with the check bits ar (01010101; 0101). Then, the exclusive-OR gates 11 to 14 produces the output signals A to D which are (0000) because of the previously described exclusive-OR function. When the output signals A to D are (0000), all of the AND gates 19 to 26 produce the respective data bits Q1 to Q8 of the output signal (00000000) because of the bubbles coupled to the respective AND gates 19 to 26. With the output signal consisting of the data bits of (00000000), all of the exclusive-OR gates 27 to 34 produce the data bits R1 to R8 which are identical in bit string to the data bits I1 to I8. The data information consisting of the data bits R1 to R8 is transferred to the output buffer circuit 8 which in turn delivers the data information without any error data bit to the outside of the memory device.

On the other hand, an error occurs in the data information with the check bits stored in the memory cell group 3 and, for this reason, the data information has a bit string of (00010101:0101). When the data information with the error bit M2 is read out from the memory cell group 3, the exclusive-OR gates 16 and 17 produce the respective output signals B and C of logic "1" due to the error bit of logic "0". Then, the error detection circuit 6 produces the output signal of (01000000) which identifies the error bit stored in the memory cell M2. With the data bit Q2 of logic "1", the exclusive-OR 28 of the error correction circuit 7 produces the data bit R2 of logic "1" even if the data bit M2 has been inverted into logic "0". As a result, the semiconductor memory device can supply the outside thereof with the data information without error bit.

However, a problem is encountered in the prior-art semiconductor memory device in diagnostic operation for the error detecting circuit and the error correction circuit. This is because of the fact that the check bits are automatically produced by the check-bit producing circuit and, for this reason, it is impossible to provide a piece of data information with an error bit from the memory cell group to the error detecting circuit. This results in that the semiconductor memory device is doubtful in reliability.

SUMMARY OF THE INVENTION

It is therefore an important object of the present invention to provide a semiconductor memory device with a high reliability.

It is also an important object of the present invention to provide a semiconductor memory device with an error detecting and correction circuit which is guaranteed to customers.

It is also an important object of the present invention to provide a semiconductor memory device with an error detecting and correction circuit capable of being subjected to a diagnostic operation.

To accomplish these objects, the present invention proposes to provide a test pattern producing circuit operative to produce dummy bits having at least one error data bit opposite in logic level to the corresponding data bit.

In accordance with the present invention, there is provided a semiconductor memory device fabricated on a semiconductor substrate and having a write-in mode, a read-out mode and a diagnostic mode, comprising; (a) a check-bit producing circuit operative to produce check-bits based on data bits of a piece of data information supplied from the outside thereof in the write-in mode; (b) a plurality of memory cell groups each capable of storing the data bits of the data information and the check bits produced by the check-bit producing circuit; (c) an error detecting circuit operative to identify at least one error bit opposite in logic level from the corresponding data bit on the basis of the data information stored in the memory cell group and to produce an output signal consisting of a plurality of data bits and representing the error bit, if any, in the read-out mode or the diagnostic mode; (d) an error correction circuit supplied with the data bits of the data information stored in the memory cell group and the output signal produced by the error detecting circuit and operative to change the error data bit to the corresponding data bit in the read-out mode or the diagnostic mode; and (e) a test pattern producing circuit operative to produce test pattern or dummy bits having an error data bit and check bits produced on the basis of data bits without the error data bit and supplying the dummy bits to the error detecting circuit in the diagnostic mode.

BRIEF DESCRIPTION OF THE DRAWINGS

The features and advantages of a semiconductor memory device according to the present invention will be more clearly understood from the following description taken in conjunction with the accompanying drawings in which.

DESCRIPTION OF THE PREFERRED EMBODIMENTS

First Embodiment

Figure 1:
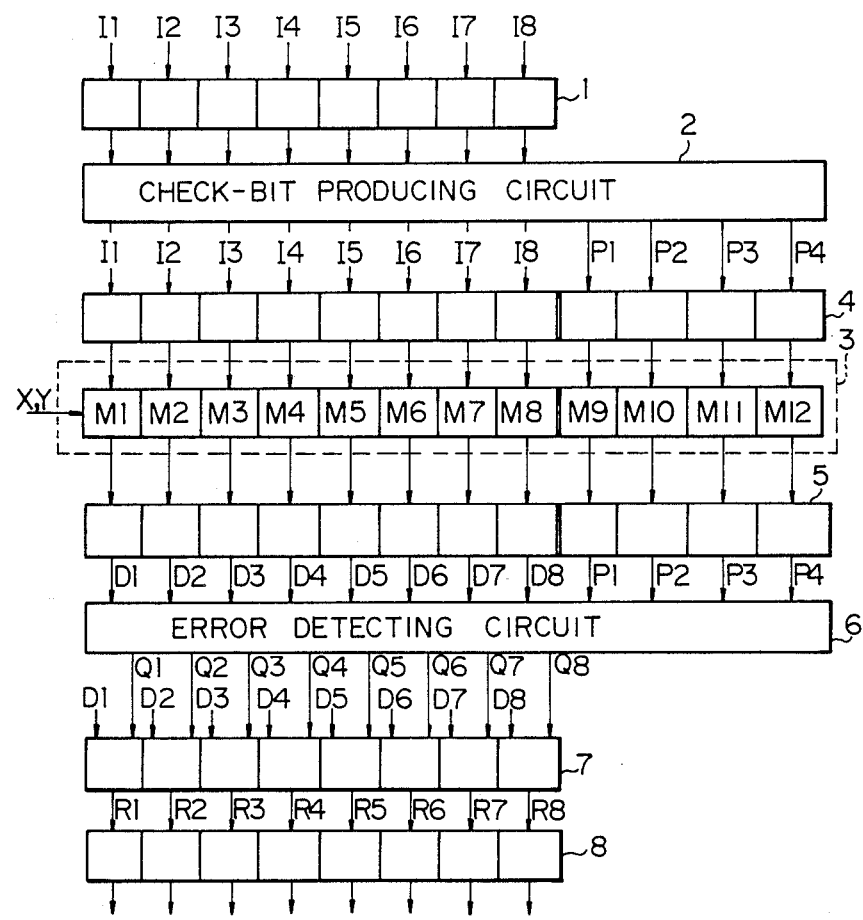
FIG. 1 is a block diagram showing the arrangement of a known semiconductor memory device.
Figure 2:
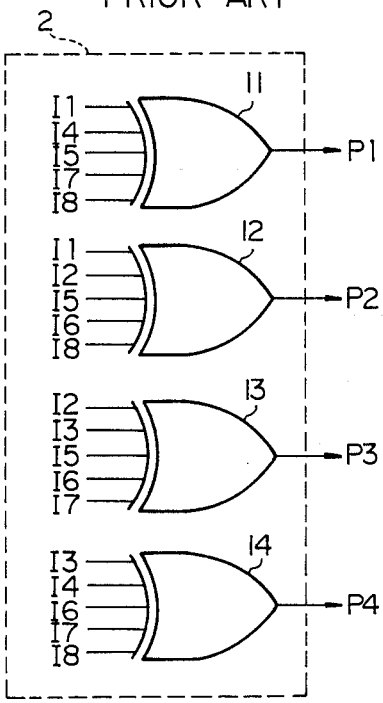
FIG. 2 is a logic diagram showing the arrangement of the check-bit producing circuit incorporated in the semiconductor memory device illustrated in FIG. 1.
Figure 3:
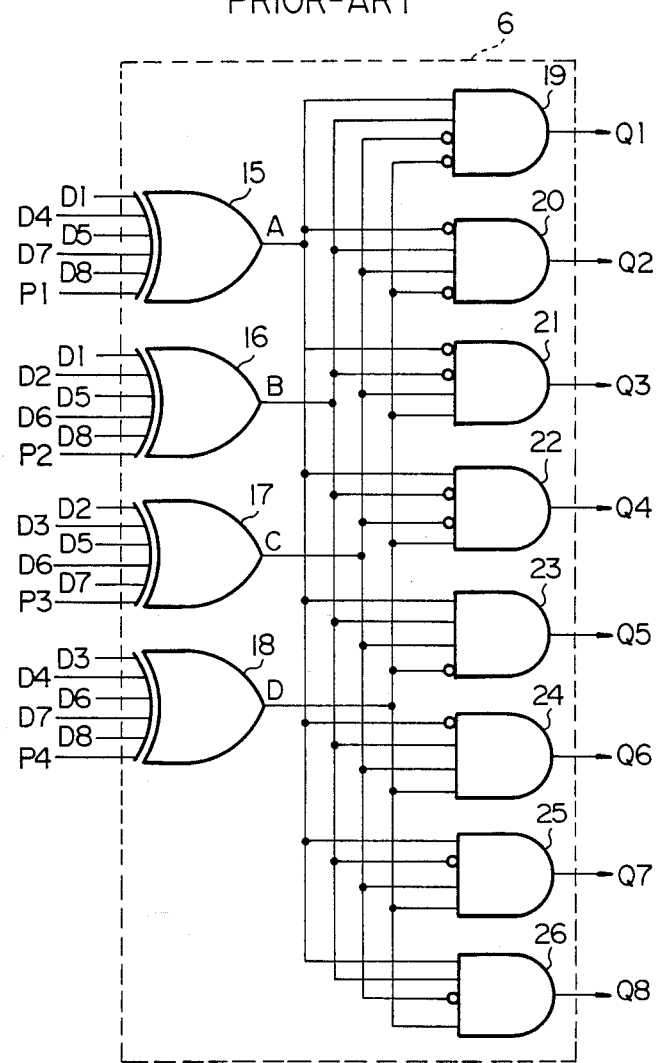
FIG. 3 is a logic diagram showing the arrangement of the error detecting circuit incorporated in the semiconductor memory device illustrated in FIG. 1.
Figure 4:
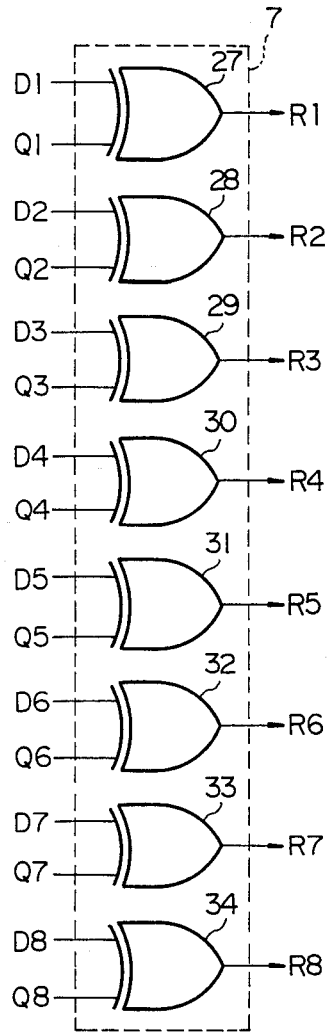
FIG. 4 is a logic diagram showing the arrangement of the error correction circuit incorporated in the semiconductor memory device illustrated in FIG. 1.
Figure 5:
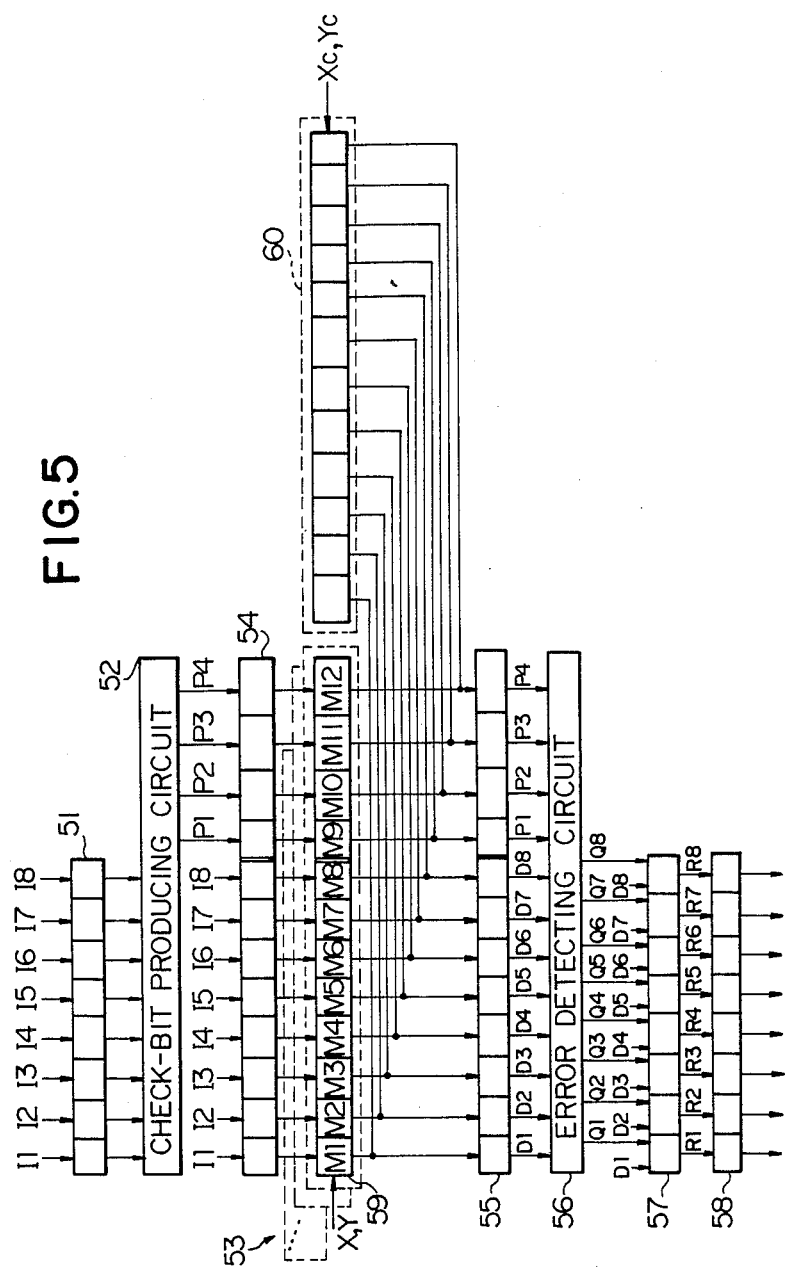
FIG. 5 is a block diagram showing the arrangement of a semiconductor memory device embodying the present invention.

Referring to FIG. 5 of the drawings, there is shown the circuit arrangement of a semiconductor memory device embodying the present invention. The semiconductor memory device illustrated in FIG. 5 is fabricated on a semiconductor substrate and comprises an input buffer circuit 51 operative to latch a piece of data information consisting of eight data bits I1 to I8 supplied from the outside thereof, a check-bit producing circuit 52 operative to append four check bits P1 to P4 to the data information supplied from the input buffer circuit 1, a plurality of memory cell groups 53 each provided with twelve memory cells where the data information with the check bits is stored and having an address which is specified by row and column address signal X and Y, a write-in circuit 54 operative to decide whether or not the data information with the check bits should be written into one of the memory cell groups 53 and to carry out a write-in operation in the case of a write-in decision, a read-out circuit 55 operative to read out the data information with the check bits P1 to P4 from one of the memory cell groups 53, an error detecting circuit 56 operative to detect whether or not the data information fed from the read-out circuit 55 has an error among the data bits and to identify the data bit with the error, an error correction circuit 57 operative to retrieve the correct data bit, and an output buffer circuit 58 operative to deliver the data information without error data bit to the outside of the semiconductor memory device. Although the plural number of the memory circuits are arranged in rows and columns in the semiconductor memory device so as to be specified by the row and column address signals X and Y, only one memory cell group is designate by reference numeral 59 for the following description and the memory cells thereof are labeled by M1 to M12. The input buffer circuit 51, the check-bit producing circuit 52, the memory cell group 59, the write-in circuit 54, the read-out circuit 55, the error detecting circuit 56, the error correction circuit 57 and the output buffer circuit 58 are similar in circuit arrangement to the corresponding circuits illustrated in FIG. 1 so that detailed description of the circuit arrangement is omitted for the sake of simplicity.

The semiconductor memory device illustrated in FIG. 5 further comprises a test pattern producing circuit 60 which is provided with twelve read-only memory cells, and the twelve read-only memory cells store a string of test pattern or dummy bits. The dummy bits include an error bit and check bits produced on the basis of the correct data bits and are supplied to the read-out circuit 55 in the presence of row and column address signals Xc and Yc identifying the test pattern producing circuit 60. In this instance, the dummy bits have respective logic levels of (00010101;0101) which are identical with the data information with the error data bit described in connection with the prior-art semiconductor memory device. As described in the second paragraph of page 6, the bit string (00010101:0101) includes an error bit at the second position from the left side, and, accordingly, the dummy bits (00010101:0101) represent a piece of data information where an error is intentionally incorporated. If the error is eliminated from the piece of data information represented by the dummy bits, the dummy bits are changed to (01010101:0101). In the bit string thus changed, the error bit of "0" (the second position from the left side) is inverted to the correct bit of "1" (which corresponds to the error bit in view of the bit position), so that the correct bit will be hereinunder referred to as "corresponding data bit". Then, the dummy bits of (00010101;0101) are expected to produce a string of data bits of (01010101) without error bit. By the way, the bit string of (00010101;0101) can not be produced by the check-bit producing circuit 52 because the check-bit producing circuit 52 automatically produces the check bits P1 to P4 of (0011) when the data information of (00010101) is supplied thereto.

When the test pattern producing circuit 60 is activated by

In this instance, since the test pattern producing circuit 60 is formed of the twelve read-only memory cells as described hereinbefore, the dummy bits are memorized in the non-volatile manner in accordance with the cell structure of the read-only memory cells. For example, if the read-only memory cells are of the mark ROM type (the structure of which is well known in the art), the dummy bits are written into the memory cells in the fabrication process of the semiconductor device. As will be understood from the description in the next paragraph, the dummy bits are supplied to the error detection circuit 56 which in turn transfers the dummy bits to the error correction circuit 57 for diagnostic operation.

When the test pattern producing circuit 60 is activated by the row and column address signals Xc and Yc in diagnostic operations, the dummy bits of (00010101;0101) are supplied from the test pattern producing circuit 60 to the read-out circuit 55. With the dummy bits of (00010101;0101), the error detecting circuit 56 produces the output signal of (01000000) which in turn is supplied to the error correction circuit 57. The dummy bits of (00010101;0101) are directly supplied from the read-out circuit 55 to the error correction circuit 57 so that the error correction circuit 57 produces the data information of (01010101) which is transferred to the output buffer circuit 58. As described hereinbefore, the dummy bits (00010101;0101) are expected to produce the data bits of (01010101), then the error detecting circuit 56 and the error correction circuit 57 are diagnosed by comparing the data bits supplied from the output buffer circuit 58 with the expectancy.

Second Embodiment

Figure 6:
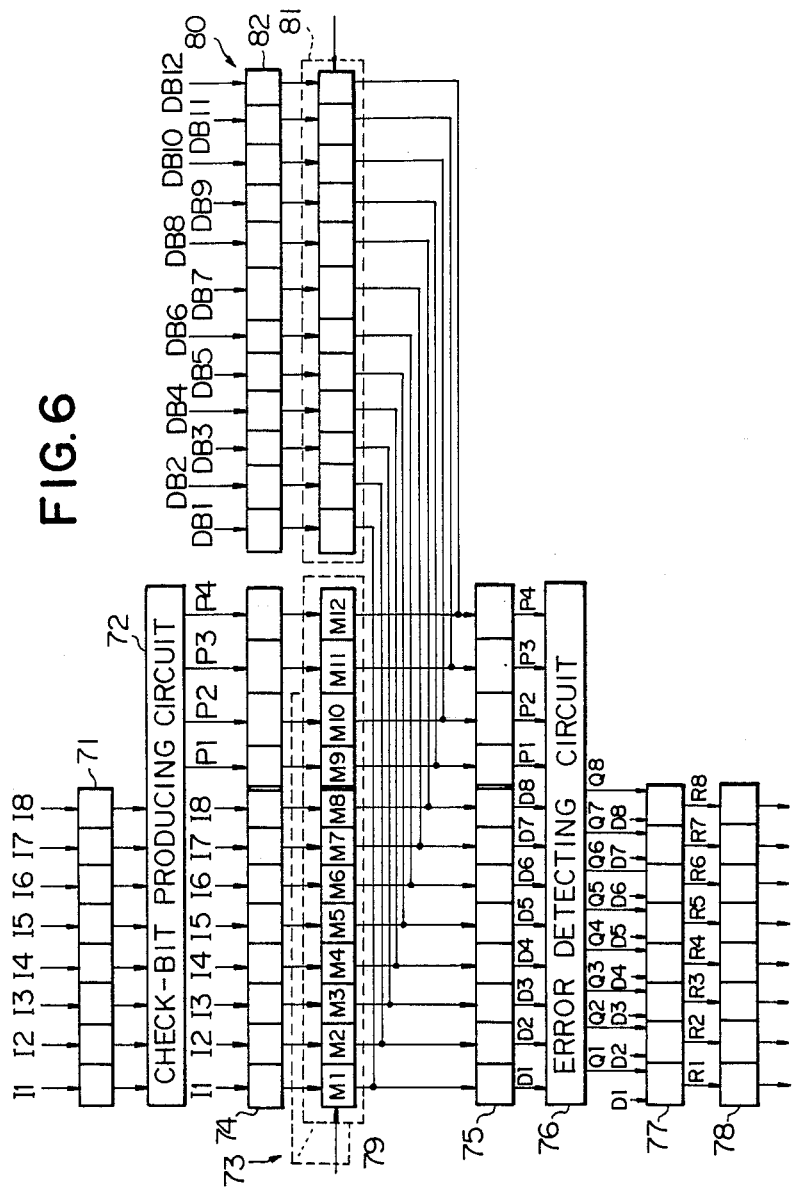
FIG. 6 is a block diagram showing the arrangement of another semiconductor memory device embodying the present invention.

Turning to FIG. 6 of the drawings, the circuit arrangement of another semiconductor memory device is illustrated and comprises an input buffer circuit 71 operative to latch a piece of data information consisting of eight data bits I1 to I8 supplied from the outside thereof, a check-bit producing circuit 72 operative to append four check bits P1 to P4 to the data information supplied from the input buffer circuit 1, a plurality of memory cell groups 73 each provided with twelve memory cells where the data information with the check bits is stored and having an address which is specified by row and column address signal X and Y, a write-in circuit 74 operative to decide whether or not the data information with the check bits should be written into one of the memory cell group 73 and to carry out a write-in operation in the case of a write-in decision, a read-out circuit 75 operative to read out the data information with the check bits P1 to P4 from one of the memory cell group 73, an error detecting circuit 76 operative to detect whether or not the data information fed from the readout circuit 75 has an error among the data bits and to identify the data bit with the error, an error correction circuit 77 operative to retrieve the correct data bit, and an output buffer circuit 78 operative to deliver the data information without error data bit to the outside of the semiconductor memory device. Though not shown in the drawings, the semiconductor memory device illustrated in FIG. 6 is also fabricated on a single semiconductor substrate. Although the plural number of the memory cell groups are included in the semiconductor memory device, only one memory cell group is designated by reference numeral 79 for the following description and the memory cells thereof are labeled by M1 to M12. The input buffer circuit 71, the check-bit producing circuit 72, the memory cell group 79, the write-in circuit 74, the read-out circuit 75, the error detecting circuit 76, the error correction circuit 77 and the output buffer circuit 78 are similar in circuit arrangement to the corresponding group and circuits illustrated in FIG. 1 so that detailed description of the circuit arrangement is omitted for the sake of simplicity.

The semiconductor memory device illustrated in FIG. 6 further comprises a test pattern producing circuit 80 and the test pattern producing circuit 80 has a register circuit 81 temporally storing a string of dummy bits DB1 to DB12 and an auxiliary write-in circuit 82. The auxiliary write-in circuit 82 is operative to write in the dummy bits DB1 to DB12 fed from the outside of the memory device such as, for example, an analyzer or from an internal memory cells. The dummy bits DB1 to DB12 also have an error bit just like the dummy bits of the first embodiment. Then, the diagnostic operations are achieved for the error detecting circuit 76 and the error correction circuit 77 by using the dummy bits DB1 to DB12. In this instance, the dummy bits are not fixed as those of the semiconductor memory device illustrated in FIG. 5 s that the diagnostic operations are achieved for the respective logic gates of the error detecting an correcting circuits.

The semiconductor memory devices described above are provided with the single testing pattern producing circuits 60 and 80, respectively, however the semiconductor memory device may be associated with a plurality of test pattern producing circuits. The test pattern producing circuit is applicable to the error detecting and correcting circuits capable of detecting and correcting more than one error bit.

Although particular embodiment of the present invention have been shown and described, it will be obvious to those skilled in the art that various changes and modifications may be made without departing from the spirit and scope of the present invention.

As will be understood from the foregoing description, the semiconductor memory device according to the present invention is advantageous over the prior-art semiconductor memory device in reliability because of the diagnostic operations for the error detecting circuit and the error correction circuit.

What is claimed is:

1. A semiconductor memory device fabricated on a single semiconductor substrate and having a write-in mode, a read-out mode and a diagnostic mode, comprising:
   (a) a check-bit producing circuit operative to produce check bits based on data bits representing a piece of data information supplied from the outside of said semiconductor memory device in said write-in mode, said check-bits being used to decide whether or not any error is introduced in said data information in said semiconductor memory device, said error being represented by an error bit;
   (b) a plurality of memory cell groups each capable of storing the data bits representing said data information and the check bits produced by said check-bit producing circuit;
   (c) an error detecting circuit operative to identify at least one error bit in said data bits read out from one of said memory cell groups or in dummy bits on the basis of the data bits representing said data information stored in said one of said memory group and said check bits or alternatively on the basis of said dummy bits and to produce an output signal consisting of a plurality of data bits and representing said at least one error bit, if any, in said read-out mode or said diagnostic mode;
   (d) an error correction circuit supplied with the data bits representing said data information stored in said one of said memory cell group, said check bits in said one of said memory cell group and said output signal produced by said error detecting circuit or alternatively with said dummy bits and said output signal and operative to correct said at least one error bit in said read-out mode or said diagnostic mode; and
   (e) a test pattern producing circuit operative to supply said error detecting circuit and said error correction circuit with said dummy bits having said error bit and check bits which are produced on the basis of said data bits without said error bit, said test pattern producing circuit supplying the dummy bits to said error detecting circuit and said error correction circuit while bypassing any of said memory cell groups in said diagnostic mode.

2. A semiconductor memory device as set forth in claim 1, in which said test pattern producing circuit comprises a plurality of read only memory cells operative to produce said dummy bits when the read only memory cells are specified by address signals.

3. A semiconductor memory device as set forth in claim 1, in which said test pattern producing circuit comprises a register circuit capable of storing said dummy bits and an auxiliary write-in circuit operative to write said dummy bits into said register circuit, said register circuit being operative to supply said dummy bits to said error detecting circuit in said diagnostic mode.

4. A semiconductor memory device as set forth in claim 1, in which said semiconductor memory device further comprises an input buffer circuit operative to receive the data bits of said data information and to transfer the data bits to said check-bit producing circuit, a write-in circuit supplied with said data bits fed from said input buffer circuit and said check bits fed from said check-bit producing circuit and operative to write said data bits and said check bits into said memory cell group, a read-out circuit supplied from said memory cell group with said data bits and said check bits and to transfer said data bits and said check bits to said error detecting circuit, and an output buffer circuit operative to receive the data bits corrected by said error correction circuit and to transfer the data bits to the outside of the semiconductor memory device.

5. A semiconductor memory device as set forth in claim 4, in which said check-bit producing circuit comprises a plurality of exclusive-OR gates each supplied with the data bits selected from the data bits of said data information and producing one of said check bits.

6. A semiconductor memory device as set forth in claim 4, in which said error detecting circuit comprises a plurality of exclusive-OR gates each supplied with the data bits selected from the data bits of said data information and at least one check bit selected from the check bits produced by said check-bit producing circuit and operative to produce an output signal, and a plurality of AND gates each supplied with the output signals selected from the output signals produced by said exclusive-OR gates and the inverse of non-selected output signal or signals, said AND gates being operative to produce an output signal consisting of a plurality of data bits and representing said at least one error data bit, if any.

7. A semiconductor memory device as set forth in claim 6, in which said error correction circuit comprises a plurality of exclusive-OR gates each supplied with one of the data bits of said data information fed from said read-out circuit and one of the data bits of said output signal fed from said error detecting circuit and operative to produce at least one data bit opposite in logic level to said at least one error data bit for correction of said at least one error data bit.

8. A semiconductor memory device fabricated on a single semiconductor substrate and having a write-in mode, a read-mode and a diagnostic mode, comprising:
   (a) an input buffer circuit operative to receive data bits representing a piece of, data information for temporary storage;
   (b) a check-bit producing circuit having a plurality of exclusive-OR gates each supplied from said input buffer circuit with the data bits selected from the data bits representing said data information and producing check bits in said write-mode, said check bits being used to decide whether or not any error is introduced in said data information in said semiconductor device;
   (c) a plurality of memory cell groups each capable of storing the data bits representing said data information and the check bits produced by said check-bit producing circuit;
   (d) a write-in circuit supplied with said data bits fed from said input buffer circuit and said check bits fed from said check-bit producing circuit and operative to write said data bits and said check bits into said memory cell group specified by address signals in said write-in mode;
   (e) a read-out circuit supplied with said data bits and check bits from said memory cell group for temporary storage in said read-out mode and with dummy bits in said diagnostic mode;
   (f) an error detecting circuit comprising a plurality of exclusive-OR gates each supplied with the data bits selected from the data bits representing said data information and one of said check bits selected from the check bits produced by said check-bit producing circuit and operative to produce an output signal, and a plurality of AND gates each supplied with the output signals selected from the output signals produced by said exclusive-OR gates and the inverse of non-selected output signal or signals, said AND gates being operative to produce an output signal consisting of a plurality of data bits and representing an error data bit opposite in logic level to a corresponding data bit of the data bits representing said data information, if any, in said read-out mode, said error detecting circuit being alternatively supplied with said dummy bits to produce said output signal in said diagnostic mode;
   (g) an error correction circuit comprising a plurality of exclusive-OR gates each supplied with one of the data bits representing said data information or alternatively said dummy bits fed from said read-out circuit and one of the data bits of said output signal fed from said error detecting circuit and operative to produce a data bit opposite in logic level to said error data bit in said read-out mode or said diagnostic mode;
   (h) an output buffer circuit operative to receive the data bits corrected by said error correction circuit and to transfer the data bits to the outside of the semiconductor memory device; and
   (i) a test pattern producing circuit comprising a plurality of read only pattern cells operative to produce said dummy bits having said error bit and check bits produced on the basis of said data bits without said error bit, said test pattern producing circuit supplying said dummy bits to said read-out circuit while bypassing any of said memory cell groups when the read only memory cells are specified by address signals in said diagnostic mode.

9. A semi-conductor memory device fabricated on a single semiconductor substrate and having a write-mode, a read-out mode and a diagnostic mode, comprising:
   (a) an input buffer circuit operative to receive data bits representing a piece of data information for temporary storage;
   (b) a check-bit producing circuit having a plurality of exclusive-OR gates each supplied from said input buffer circuit with the data bits selected from the data bits representing said data information and producing a check bit in said write-in mode, said check bits being used to decide whether or not any error in incorporated in said data information;
   (b) a plurality of memory cell groups each capable of storing the data bits representing said data information and the check bits produced by said check-bit producing circuit;
   (c) a write-in circuit supplied with said data bits from said input buffer circuit and said bits fed from said check-bit producing circuit and operative to write said data bits and said check bits into said memory cell group in said write-in mode;
   (d) a read-out circuit supplied with said data bits and said check bits from said memory cell group for temporary storage in said read-out mode or alternatively with dummy bits in said diagnostic mode;
   (e) an error detecting circuit comprising a plurality of exclusive-OR gates each supplied with the data bits selected from the data bits representing said data information and one of said check bits selected from the check bits and operative to produce output signals, and a plurality of AND gates each supplied with the output signals selected from the output signals produced by said exclusive-OR gates and the inverse of non-selected output signal or signals, said AND gates being operative to produce an output signal consisting of a plurality of data bits and representing an error data bit opposite in logic level to a corresponding data bit incorporated in said data bits, if any, in said read-out mode, said error detecting circuit being alternatively supplied with said dummy bits to produce said output signal in said diagnostic mode;

(f) an error correction circuit comprising a plurality of exclusive-OR gates each supplied with one of the data bits of said data information fed from said read-out circuit and one of the data bits of said output signal fed from said error detecting circuit and operative to produce a data bit opposite in logic level to said error bit in said read-out mode, said error correction circuit being alternatively supplied with said dummy bits and said circuit signal to produce said data bit opposite in logic level to said error bit in said diagnostic mode;

(g) an output buffer circuit operative to receive the data bits corrected by said error correction circuit and to transfer the data bits to the outside of the semiconductor memory device; and (h) a test pattern producing circuit comprising a register circuit capable of storing said dummy bits having said error data bit and check bits produced on the basis of said data bits without the error bit, and an auxiliary write-in circuit operative to write said dummy bits into said register circuit, said register circuit being operative to supply said dummy bits to said read-out circuit without via any of said memory cell groups in said diagnostic mode.

* * * * *

UNITED STATES PATENT AND TRADEMARK OFFICE
CERTIFICATE OF CORRECTION

PATENT NO. : 4,878,220

DATED : October 31, 1989

INVENTOR(S) : HASHIMOTO

It is certified that error appears in the above-identified patent and that said Letters Patent is hereby corrected as shown below:

Title page:

Abstract, line 16, delete "bitm" and insert --bit--;

Column 1, line 46, delete "red-out" and insert --read-out--;

Column 2, line 54, delete "2," and insert --22,--;

Column 3, line 11, delete "writein" and insert --write-in--;

Column 6, lines 12 & 13, delete "When the test pattern producing circuit 60 is activated by";

Column 6, line 19, delete "mark" and insert --mask--;

Column 7, line 38, delete "s" and insert --so--;

Column 11, line 12, delete "circuit" and insert --output--;

Signed and Sealed this

Sixth Day of November, 1990

Attest:

HARRY F. MANBECK, JR.

*Attesting Officer*  *Commissioner of Patents and Trademarks*